US007438955B2

(12) United States Patent  (10) Patent No.:    US 7,438,955 B2
Ramos  (45) Date of Patent:    Oct. 21, 2008

(54) TITANIUM NITRIDE THIN FILM FORMATION ON METAL SUBSTRATE BY CHEMICAL VAPOR DEPOSITION IN A MAGNETIZED SHEET PLASMA SOURCE

(75) Inventor: Henry J. Ramos, Quezon (PH)

(73) Assignees: Philippine Council for Advanced Science and Technology Research and Development, Metro Manila (PH); University of the Philippines Diliman, Quezon City (PH)

( * ) Notice: Subject to any disclaimer, the term of this patent is extended or adjusted under 35 U.S.C. 154(b) by 547 days.

(21) Appl. No.: 10/505,994

(22) PCT Filed: Feb. 27, 2002

(86) PCT No.: PCT/PH02/00003

§ 371 (c)(1), (2), (4) Date: Aug. 27, 2004

(87) PCT Pub. No.: WO03/074755

PCT Pub. Date: Sep. 12, 2003

(65) Prior Publication Data

US 2005/0126903 A1    Jun. 16, 2005

(51) Int. Cl.
*H05H 1/24* (2006.01)
*C23C 16/00* (2006.01)
*C23C 14/00* (2006.01)
*C23C 14/32* (2006.01)

(52) U.S. Cl. .................... 427/569; 427/248.1; 427/250; 427/255.23; 427/576; 204/192.12; 204/192.16

(58) Field of Classification Search ........................ None
See application file for complete search history.

(56) References Cited

U.S. PATENT DOCUMENTS 4,885,068 A * 12/1989 Uramoto et al. ........ 204/192.11
5,192,410 A *  3/1993 Ito et al. ................ 204/192.16

(Continued)

FOREIGN PATENT DOCUMENTS

| JP | 2073963 | 3/1990 |
| JP | 6088222 | 3/1994 |
| JP | 6264212 | 9/1994 |
| JP | 11097884 | 4/1999 |

OTHER PUBLICATIONS

Abate et al. Optimization and enhancement of H- ions in a magnetized sheet plasma, Review of Scientific Instruments 71(10) Oct. 2000 pp. 3689-3695.*

(Continued)

*Primary Examiner*—Timothy Meeks
*Assistant Examiner*—Kelly M Stouffer
(74) *Attorney, Agent, or Firm*—Ohlandt, Greeley, Ruggiero & Perle, L.L.P.

(57) ABSTRACT

A procedure for the synthesis of titanium nitride (TiN) thin films on metal substrate by vapor deposition using a magnetized sheet plasma source is disclosed. TiN films on metal substrate exhibiting the stoichiometric TiN and $Ti_2N$ were synthesized in a mixed $N_2$/Ar plasma with initial gas filing ratio of preferably 1:3 under the following conditions: total initial gas filing pressure of at least about 40 mTorr, plasma current in the range of about 2A to 3A and plasma discharge potential in the range of about 125V to about 150V.

12 Claims, 7 Drawing Sheets

U.S. PATENT DOCUMENTS

| | | | |
|---|---|---|---|
| 5,439,574 A * | 8/1995 | Kobayashi et al. | 204/192.12 |
| 5,487,922 A * | 1/1996 | Nieh et al. | 427/528 |
| 5,919,342 A * | 7/1999 | Ngan | 204/192.22 |
| 6,071,572 A * | 6/2000 | Mosely et al. | 427/570 |
| 2001/0030125 A1 * | 10/2001 | D'Couto et al. | 204/192.17 |
| 2002/0125123 A1 * | 9/2002 | Ngan et al. | 204/192.17 |

OTHER PUBLICATIONS

Sanchez et al. Extraction characteristics of H- ions ina magnetized sheet plasma. Plasma Source Sci Technol. 5 (1996) pp. 416-423.*

Jose Karl et al., "Extraction characteristics of H- ions in a Magnetized sheet plasma", 1996, pp. 416-423.

Yohannes Abate and Henry J. Ramos, "Review of Scientific Instruments", Oct. 2000, pp. 3689-3595.

* cited by examiner

TITANIUM NITRIDE THIN FILM FORMATION ON METAL SUBSTRATE BY CHEMICAL VAPOR DEPOSITION IN A MAGNETIZED SHEET PLASMA SOURCE

CROSS-REFERENCE TO RELATED APPLICATIONS

The present application is a U.S. national stage application under 35 U.S.C. 371 of International Application No. PCT/PH02/00003, filed Feb. 27, 2002.

BACKGROUND OF THE INVENTION

1. Field of the Invention

The invention relates to a method of film deposition. More particularly, the invention relates to a titanium nitride film chemical vapor deposition process on metal substrate using a magnetized sheet plasma source.

2. Description of the Related Art

Interest in new coatings and surface treatment methods has been on the upsurge during the last decade of the 1990s, especially for titanium nitride (TiN), gauging from the number of papers/patents published on this ceramic material. Titanium nitride films prepared on silicon are widely used as diffraction barrier layers in large-scale integrated circuits. A TiN film is also a remarkably hard and wear-resistant coating on tools since it decreases the rate of abrasive wear during the cutting process as well as the chemical interaction between the tool and the work piece because of its chemical inertness. TiN is a very stable compound that enhances the pitting resistance of many substrate materials in most environments. Several techniques such as chemical vapor deposition, physical vapor deposition, ion plating, ion beam-assisted deposition, sputtering, and hybrid processes have been used to prepare TiN films. The films produced by these techniques, however, often exhibit poor adhesion to the substrate. Coupled with this problem is the requirement of a high deposition temperature (>500 C) for the effective formation of the TiN film and the relatively long duration of time required for thin film formation. In many of these techniques, the plasma dimensions, and subsequently, the substrate size also limit the process of film deposition.

SUMMARY OF THE INVENTION

The present invention, in one broad sense, is the discovery that titanium nitride film can be synthesized on metal substrate using a magnetized sheet plasma source.

There is a need in the art for a deposition process where a) there is no heating mechanism introduced, b) the synthesis of the film is relatively short, and c) the synthesis can be done over a wide area of substrate surface, without sacrificing the quality of the film. A modified magnetized sheet plasma ion source (Plasma Sources Sci. Technol. 8(1996) pp. 416-423 and Rev. Sci. Instrum. 71 (2000) pp. 3689-3695) is a suitable contribution to the art of deposition of titanium nitride in the present invention satisfying the foregoing advantages. Although the invention demonstrates the capacity of synthesizing titanium nitride for small-sized samples, the wide area plasma could very well serve the coating of larger samples. The relatively short duration of coating the titanium nitride film on metal substrate without the use of heating mechanisms makes this invention very promising for nitriding of metals.

BRIEF DESCRIPTION OF THE DRAWINGS

The detailed description of the invention can be readily appreciated in conjunction with the accompanying drawings, in which.

DETAILED DESCRIPTION OF THE INVENTION

The teachings of the present invention can be readily understood with reference to the accompanying figures, in which details of the preferred manner of practicing the present art are described. Accordingly, persons of skill in the appropriate arts may modify the disclosures of the present invention but still obtain the favorable results described herein. Since the plasma source and its discharge characteristics are key to the deposition process, a description of the same is in order.

Figure 1:
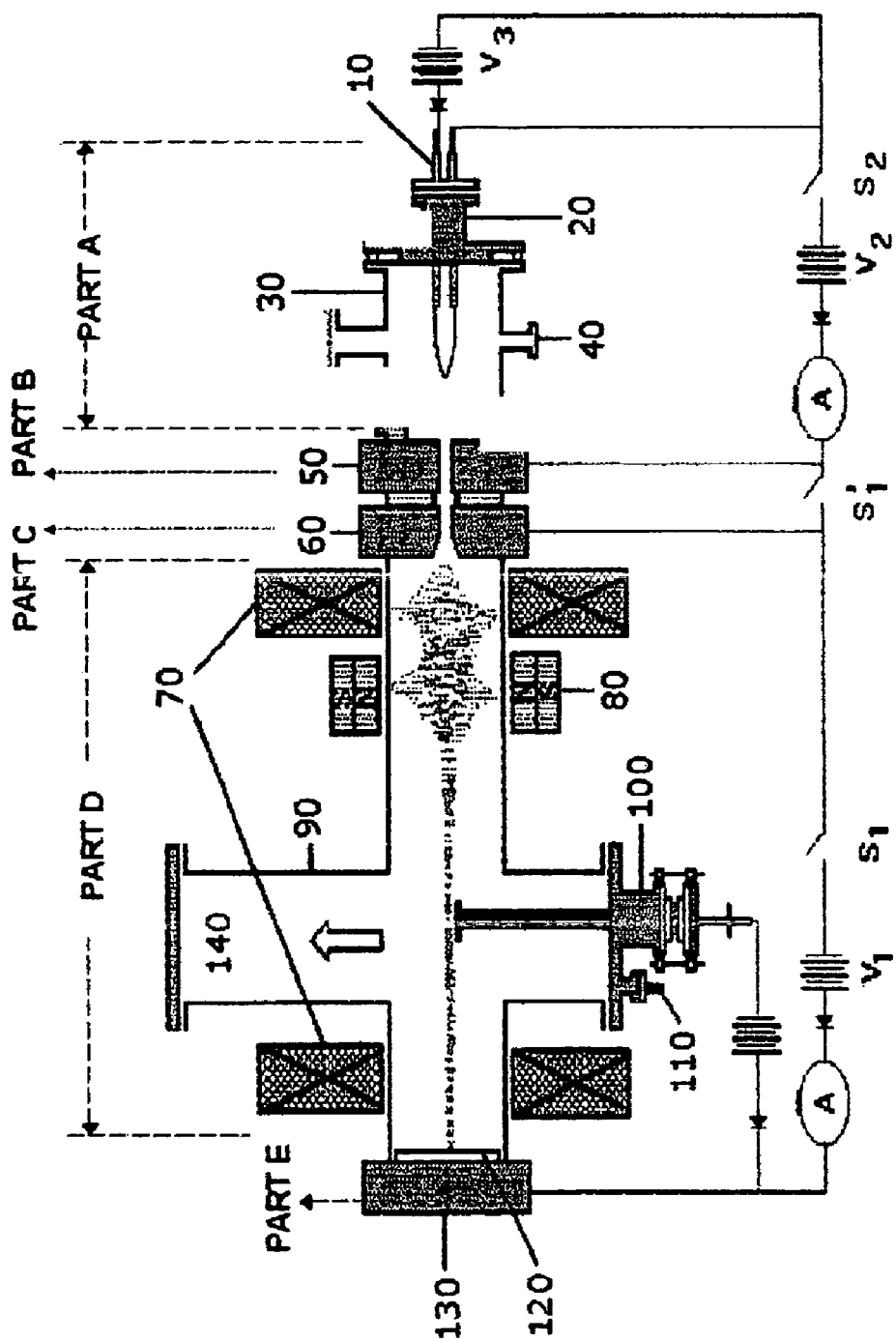
FIG. 1 is a schematic diagram of the plasma source used in the chemical vapor deposition of the TiN film in accordance with the present invention.

Referring to FIG. 1, the plasma source is composed of five main parts namely: the production chamber, shown as Part A in the diagram, the first and second plasma limiters, referred to as Parts B and C, respectively in the diagram, the main discharge vacuum chamber, referred to as Part D in the diagram, and the anode or end target, referred to as Part E in the diagram. Subsequent parts referring to FIG. 1 are numbered correspondingly as the description proceeds.

In this particular source used for the invention, the production chamber comprises of a single tungsten wire connected to a chuck of electrical feedthrough rods (10) by stainless steel screws. The filament is used as the source of ionizing electrons by thermionic emission when connected to a power supply V3 in FIG. 1. A stainless steel assembly (20) connects the electrical feedtrough to the main body of the production chamber. The production chamber also comprises an enclosing chamber of cylindrical glass (30) to provide better plasma confinement within the production chamber and insulator between parts (20) and (50). A port in (20) comprises a low-leak valve for a gas feed (40). The steel assembly (20) connecting the electrical feedthroughs are water-cooled (at least about 16 C) to withstand thermal expansion and protection of rubber O-rings connecting the glass chamber to (20) and (50).

The electron emission of the tungsten cathode is characterized by a diffusion equation that expresses the relation between the radial electron diffusion coefficient $D_\perp$ across the magnetic field B and the axial electron diffusion coefficient $D_\parallel$ along B, $$\frac{D_\perp}{D_\parallel} = \frac{1}{1+(\omega\tau)^2} = \frac{1}{1+\left(\frac{\lambda_{en}}{r_{ce}}\right)^2} \quad (1)$$

where $\omega$, $\tau$, $\lambda_{en}$ and $r_{ce}$ are the electron cyclotron angular frequency, electron-neutral collision time, electron-neutral collision mean free path and electron cyclotron radius, respectively.

For the case of hydrogen gas, $\lambda_{en}$ and $r_{ce}$ are well known and approximated by the relations, $$\lambda_{en} \cong 2.0 \times 10^{-2}/P, \quad (2)$$

$$r_{ce} \cong 3.4\sqrt{T_e}/B, \quad (3)$$

where P, B and $T_e$ are the hydrogen gas pressure in Torr, magnetic field in gauss and electron temperature in eV, respectively. The cathode plasma has electron temperature of in the range of about 0.5 eV to about 1.0 eV from Langmuir probe measurements. Then the relation $$(\omega\tau)_{en} \cong 10^{-2}B/P \text{ is obtained.} \quad (4)$$

Equation (4) implies that the electron emission of the cathode decreases when $(\omega\tau)_{en} > 1$. According to Equation (4), the discharge becomes unstable for a strong magnetic field and a low pressure. At the production chamber (Part A) the pressure is typically in the range of about 0.6 Torr to about 1.0 Torr and in the range of about $10^{-1}$ Torr to $10^{-3}$ Torr at the main discharge chamber (Part D). With these conditions, the $\omega\tau$ value is estimated as $$(\omega\tau) = 10^{-2}B_{zo} \quad (5)$$

where the z-axis is taken to be along the line connecting the anode and the cathode. Equation (5) means that when the magnetic field $B_{zo}$ exceeds at 100 gauss, the electron diffusion across $B_{zo}$ is suppressed effectively. Therefore, to extract a high discharge current from the cathode, the axial magnetic field applied externally must be below 100 gauss. A pair of Helmholtz coils comprising of copper wire wound around a bobbin of fiber board provides the axial magnetic field.

Paschen's law states that a minimum voltage of the pre-discharge must be found for a pressure P and a distance d between the cathode and anode. In this plasma source, two sub-components comprising of a circular ferrite permanent magnet (50), which is the first plasma limiter, and a coreless magnetic coil (60), which is the second plasma limiter, also act as the first intermediate electrode and the second intermediate electrode for the plasma production, respectively. Initially, the first intermediate electrode (Part B in FIG. 1) acts as the anode in the pre-discharge at the cathode region. Here, plasma is created with the breakdown of hydrogen gas usually at a high initial gas filling pressure (at least about 1.0 Torr).

The gap between the cathode and the first intermediate electrode is at most about 1.5 cm. An insulator separates them. This geometry is chosen to satisfy Paschen's law and ensure a sufficient volume of ionizing electrons from the cathode to be emitted into the main chamber. The second intermediate electrode (Part C in FIG. 1) is axially displaced by at most about 1.5 cm from the first intermediate electrode. An insulator also separates the first and second intermediate electrodes. While it houses the coreless magnetic coil (60), the second intermediate electrode also serves as an auxiliary electrode in the main chamber discharge after the pre-discharge initiation. By combining the two electrodes consisting of a circular ferrite magnet and a coreless magnetic coil, respectively, the ion source becomes stable and ensures uniform current density. The combination effectively reduces the magnetic field abruptly near an ion current extraction electrode.

The circular ferrite permanent magnet (50), which is enclosed in the first intermediate electrode, has a mean diameter of 7.0 cm The coreless magnetic coil (60) enclosed in the second intermediate electrode is made from an insulated copper wire wound on a brass bobbin and operated at a coil exciting current of at most about 30 A, giving rise to at most the equivalent of 1260 A turns.

The magnetic field distributions give rise to an abrupt decrease in the discharge anode and increases in the first intermediate electrode. In the production region (Part A) a reversed magnetic field due to the combination is expected. This reversed field is very useful for cathode protection from backstreaming ions. The apertures leading from the two electrodes are covered with molybdenum for heat resistance and are designed so as to cause a difference in pressure between the cathode and main vacuum discharge regions. The differential pumping that ensures this difference also protects the cathode. The composed magnetic field distribution due to the ferrite magnet and the magnetic coil has been approximated using three ring currents. Using the Biot-Savart law, the approximate equation for the composed magnetic field B(Z) in gauss where Z in cm is measured from the center of the ferrite magnet is given by $$B(Z) = \frac{787.6}{(1+0.16Z^2)^{3/2}} - \frac{437.6}{(1+0.049Z^2)^{3/2}} + \frac{240.4}{[1+0.092(Z-3.9)^2]^{3/2}}. \quad (6)$$

The first and second terms express the magnetic field of the ferrite magnet. The third term expresses the magnetic field of the magnetic coil.

As an indication of the validity of the approximations made, experimental values of the magnetic field distributions for the ferrite permanent magnet and magnetic coil were determined separately. The approximations and the actual measurements of the magnetic field distributions are very close, particularly at points outside of the magnets.

Using Equations (2) and (3), the following relation is obtained:

$$\left(\frac{\lambda_{en}}{r_{ce}}\right)^2 \cong 3.4 \times 10^{-5}\left(\frac{1}{T_e P^2}\right)B. \quad (7)$$

At the main discharge chamber the pressure P will be typically of the order of $10^{-2}$ Torr and the electron temperature will not exceed 9 eV for a hydrogen plasma. These values reduce Equation (7) to $$\left(\frac{\lambda_{en}}{r_{ce}}\right)^2 \cong 0.15B^2. \quad (8)$$

This relation provides an upper limit for the radial component of the magnetic field that would give a uniform electron density. This means that for values of B less than about 2.6 gauss, the ion current density becomes radially uniform. The radial magnetic field profile $B_r(r)$ of the combined ferrite permanent magnet and coreless magnetic coil were similarly obtained at the extraction region and was found to be less no more than 1.0 gauss. The radial magnetic field distributions are relatively weak at the extraction electrode region, which according to Equation 8 will give a uniform ion current density radially.

The main vacuum discharge chamber (Part D in FIG. 1) is composed of a T-sectioned glass cylindrical chamber (90) one end of of which connected to the second plasma limiter (60), while the other end is connected to the anode (130). The cylinder comprises further an accessible port (140) leading to vacuum pumps and another port where the substrate holder (100) is connected.

The diffusion-pumped vacuum system is connected to the main chamber (Part D). It consists of a rotary pump as roughing pump, a mechanical pump and an oil diffusion pump. To isolate the vacuum chambers from the mechanical vibration due to the pump, a metal bellows is connected between the main discharge chamber and the pump. The attainment of high vacuum of at least about $10^{-6}$ Torr served as base pressure for the chambers before gas is fed at the production chamber (Part A). Hydrogen or argon gas is fed through a low-leak needle valve in the cathode assembly while the reactive gas (usually nitrogen) is fed by a similar low-leak needle valve (110) at the main discharge chamber. Because of the construction geometry, a circular aperture in the limiters diameter at most 1.0 cm creates a pressure gradient between the cathode chamber (high-pressure chamber) and the main discharge chamber (low-pressure chamber. The difference in pressures in chambers Part A and Part D is a most an order of two.

The anode (130) or the end target (Part E in FIG. 1) serves as plasma beam dump and is a water-cooled stainless steel hollow cylinder. A titanium (120) is attached to the anode (130).

Going back to FIG. 1 the schematic diagram indicating the circuit used in generating the plasma is also indicated. The plasma is generated inside the production chamber (Part A) by thermionic emission of a single tungsten wire using a 150V dc power supply (V3 in FIG. 1). The filament potential varied in the range of about 14V to about 18V at a corresponding current in the range of about 20 A to about 23 A. The tungsten filament is negatively biased with respect to the second intermediate electrode (limiter 60 in FIG. 1). V2 supplies the potential (in the range of about 60V and about 70V) at the production chamber at a current in the range of about 3 A to about 4 A. The potential in the range of about 125V and about 150V at the main chamber (from the limiter 60 to anode 130) is supplied by the source V1 giving rise to a corresponding current in the range of about 0.8 A to about 1.5 A. A switch S2 connected to another switch S1', which in turn is connected to another switch S1 provide a switching sequence process in the circuit from the cathode to the anode. Steady-state argon plasma is normally produced in the main chamber using this process. The plasma form is cylindrical has a diameter of at least about 1.5 cm and at least about 30 cm long from the limiters to the anode/end target.

The transformation of the cylindrical plasma is done by arranging two rectangular strong permanent magnets (at least about 1.5 kGauss on the surface) on opposite sides of the plasma column as shown in FIG. 1 (80). The z-axis is taken along the plasma column, the y-axis perpendicular to the permanent magnets and the x-axis parallel to the permanent magnets in the cross-section of the plasma volume. The magnets are set at most about 7.0 cm away from (60). The permanent magnets are positioned with their magnetic polarity as shown in FIG. 1 (60). With the magnets in place, a new magnetic cusp field with components $B_x$, $B_y$, $B_z$ along the x-axis, y-axis, and z-axis, respectively, is added to the initial magnetic field $B_{zo}$. The $B_x$ components are meant to expand the plasma column along the x-direction and the $B_y$ components cancel out in the x-y plane. The direction of the initial magnetic field $B_{zo}$ is taken to increase the field intensity towards the discharge anode (130) and to decrease it towards the second intermediate electrode (60). The combined magnetic field distribution, due to $B_{zo}$ and the two permanent magnets with components ($B_x$, $B_y$, $B_z$), effects the change of the cylindrical plasma into a sheet plasma. An adjustment in the width of the sheet plasma is effected through a relation between $B_x$ and $(B_{zo}+B_z)$. Similarly, an adjustment of the thickness of the sheet plasma if effected through a relation between $B_y$ and $(B_{zo}+B_z)$.

In carrying out the invention, several procedures were conducted in the operation of the magnetized sheet plasma source.

Evacuation of the chamber was done with a preferably a 500-l/m back-up rotary pump coupled to preferably a 10.16 cm oil diffusion pump. Pressures were monitored by ionization and Pirani gauges. Base pressure was usually in the order of at least $1.0 \times 10^{-6}$ Torr. Argon gas is fed through a slow leak needle valve (40) in the production region while a similar low leak needle valve (110) allows the reactive gas to be fed in the deposition chamber. Because of the construction geometry, a circular aperture of diameter at most about 1.0 cm in the limiters creates a pressure gradient between the production chamber (high-pressure chamber) and the deposition chamber (low-pressure chamber).

Gas pressures quoted here refer to pressures in the deposition chamber. The vacuum sensors were calibrated for nitrogen. The pressure reading was not corrected for the gas sensitivity factor for argon.

The sheet plasma form includes fast electrons within the core plasma of several millimeters and dimensions at least about $21.10 \times 13.40$ cm$^2$ accompanied by cold diffused plasma electrons at the periphery. Energetic electrons at the center of the sheet plasma having temperatures of at most about 25.0 eV are detected by using a single Langmuir probe for a 3.5 A plasma current. Under the same conditions, negative ions of titanium having ion energies to be at most about 20.0 eV are obtained using a potential-type electrostatic energy analyzer.

Clean metal substrates with dimensions of at least about $1.1 \times 1.1 \times 0.05$ cm$^3$ were used in the process, although the sheet plasma dimensions make it possible for wider area applications. The substrate is placed on a water-cooled holder (100) (preferable of temperature of at most about 10C) which is connected to an adjustable bellows enabling the sample to be positioned anywhere from the core of the sheet plasma to its outer periphery. It was determined that deposition could easily be conducted if the substrates were immersed in the core of the sheet plasma. The substrate is placed such that its plane is parallel to the plane of the sheet plasma. Provision is also made for biasing the substrate. Further discharge cleaning of the substrate was done in pure argon plasma for a few minutes.

Several samples were prepared under varying conditions of discharge (preferably in the range of about 2A to about 3A plasma current) and deposition times preferably in the range of at least 10 minutes to about 20 minutes. All samples prepared were immersed in the core of the sheet plasma. Argon pressure was set at preferably about 30 mTorr while nitrogen constituted 25% of the total gas filling pressure of at most about 40 mTorr. After deposition the samples are carefully extracted and stored for examination by X-ray diffraction (XRD), Raman spectroscopy and energy-dispersive X-ray emission (EDX) spectroscopy.

Figure 2:
FIG. 2 is a pictorial view of the gold colored TiN deposit on metal substrate

The color of the deposit is initially used as indicator of the presence or absence of TiN deposit on the substrate. TiN has a characteristic gold color. As an example of the deposition run, samples identified as D, H and I seemed likely to have TiN film deposits. These samples exhibited the characteristic yellow-gold color shown in FIG. 2. Sample D was obtained under the following conditions: plasma current of at least about 3.0 A, no bias potential and deposition time of at most 15 minutes. Sample H had the following conditions for deposition: plasma current of at least about 3.0 A, bias potential of at most about 250V and deposition time of at most 15 minutes. Sample I had the following conditions: plasma current of at least about 3.0 A, target bias potential of at most about −250V, and deposition time of at most about 20 minutes. The film color for this sample was gray. The titanium target potential did not seem to have any effect on the color of the deposited film. Without the bias potential, energetic electrons sputter the titanium target as it assumes the anode potential. With the negative bias, however, argon ions sputter the titanium target. The eventual breakdown of the film at prolonged deposition times may be a result of sputtering.

Figure 3:
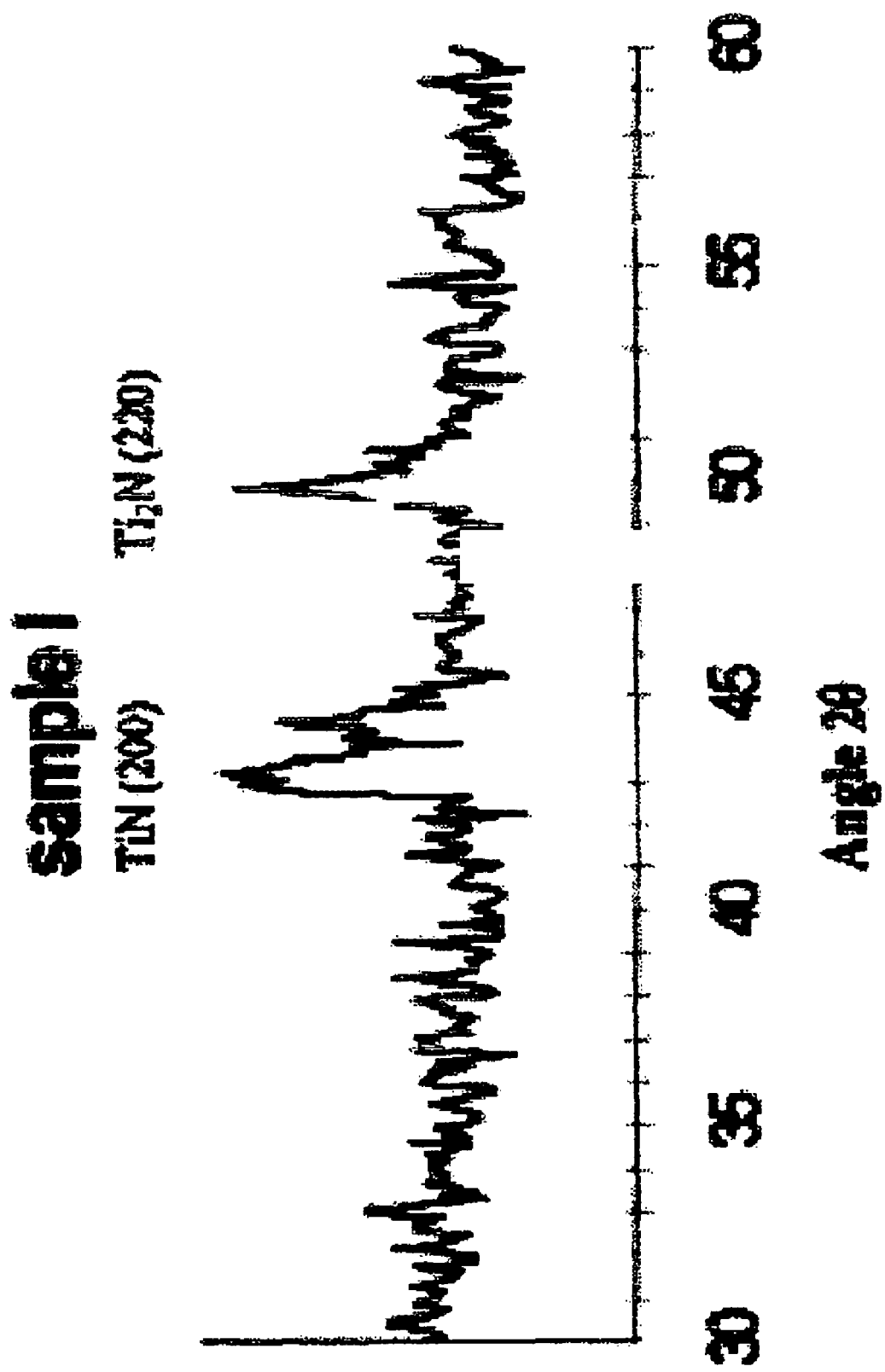
FIG. 3 is a characteristic x-ray diffraction scan of a (200) phase TiN deposited film and a (220) phase of $Ti_2N$ deposited film on metal substrate.

The deposited films were first confirmed by XRD. The XRD scan for sample I is shown in FIG. 3. The peak at 43° in FIG. 4 corresponds to the (200) phase of TiN. The adjacent peak prominent at 44.68° is attributed to the α-Fe (110) phase of the substrate. The broad peak is attributed to the lattice mismatch of the deposited TiN film and the steel substrate. The other significant peak that appears at 49.95° in FIG. 3 corresponds to the (220) phase of $Ti_2N$. This sample is exposed to the plasma for a relatively longer time. The deposited TiN have been dissociated by sputtering and then recombined to form this additional phase. Such formation has been observed to be more favorable for longer time deposition. The XRD pattern for the unbiased sample (D) has a the peak having the same as that of sample H at 2θ=43° associated with the TiN (200) phase.

Figure 4:
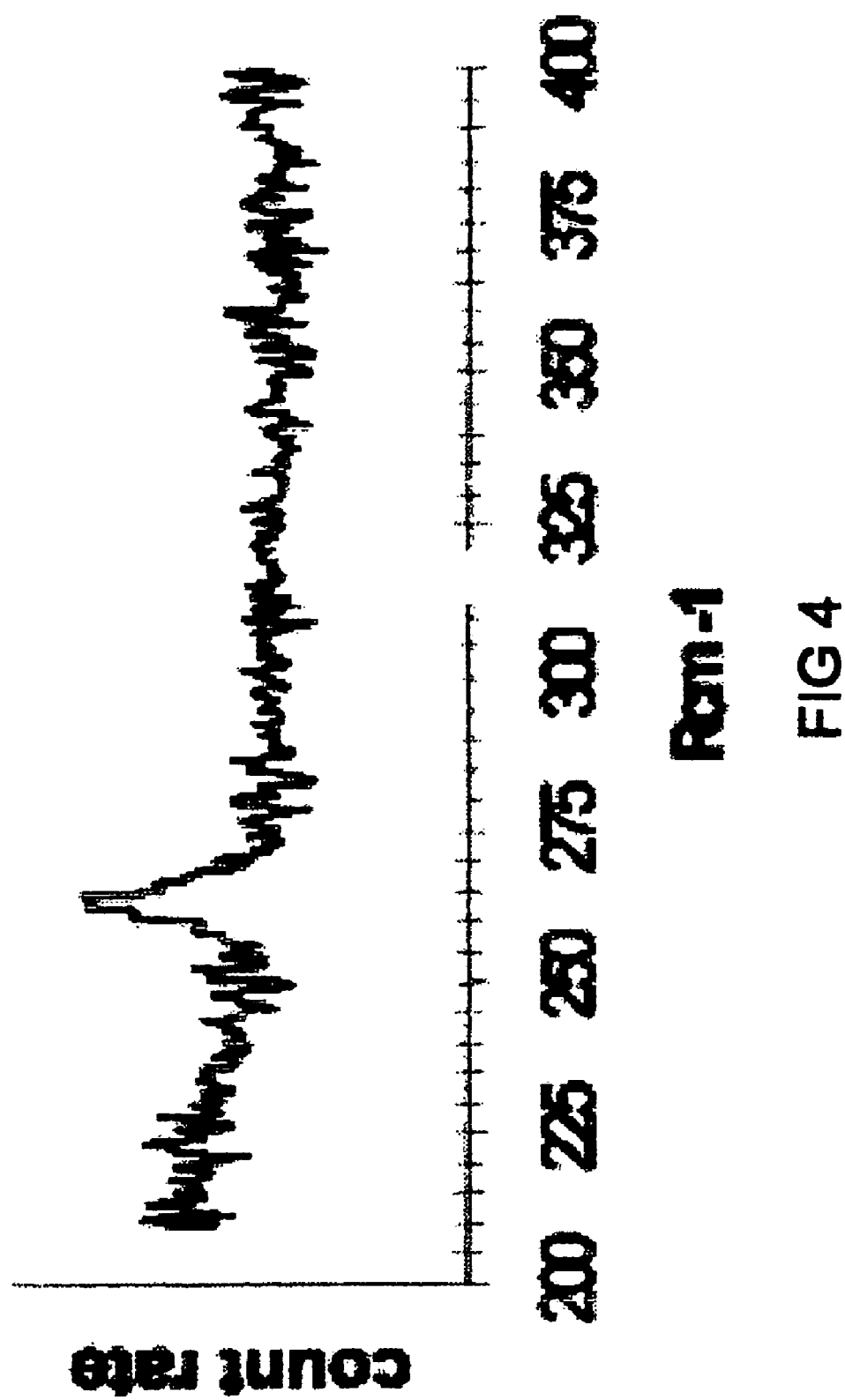
FIG. 4 is a characteristic Raman scan of the deposited TiN film (on sample D) showing the frequency shift at 267 $cm^{-1}$.
Figure 5:
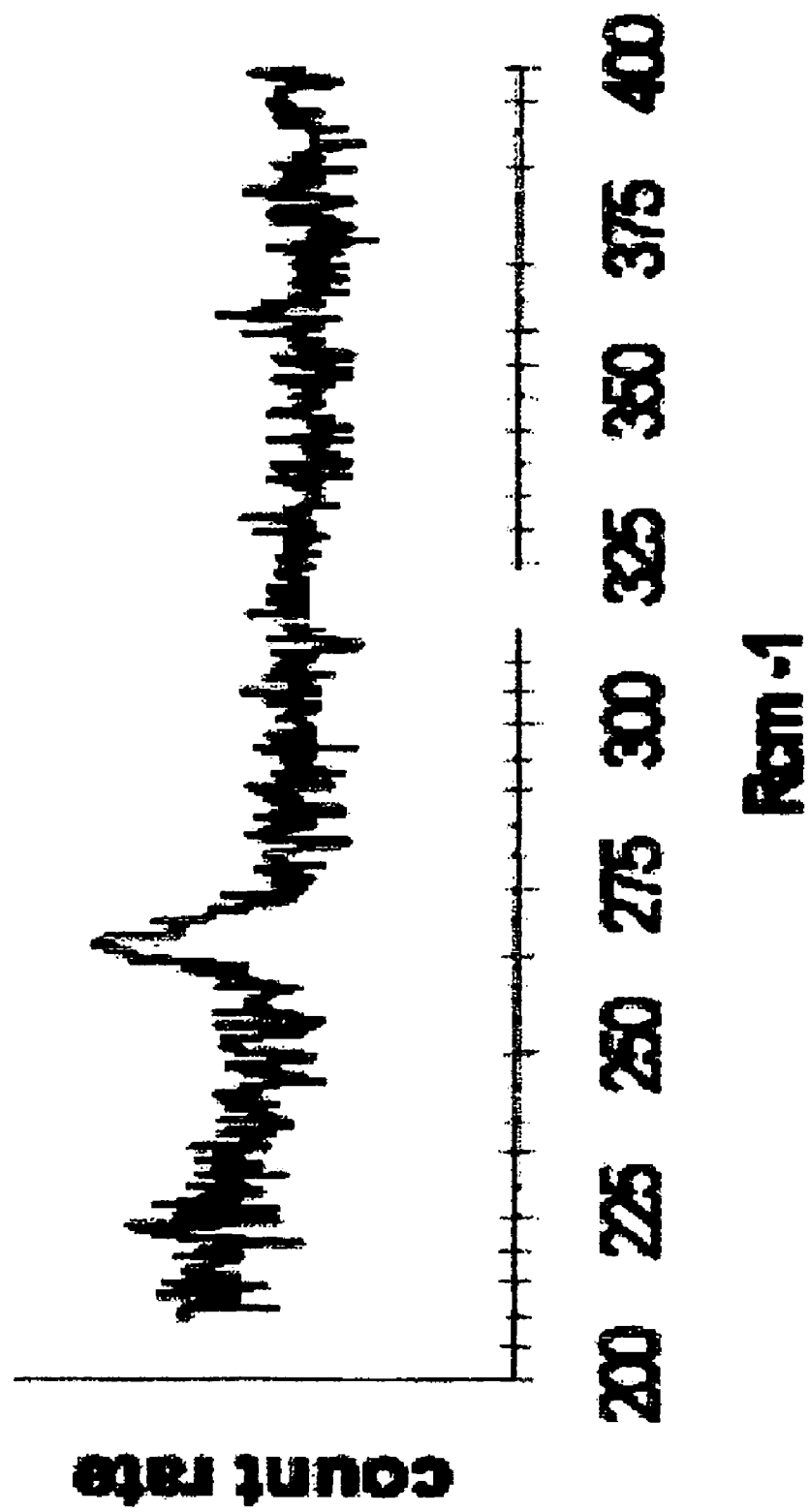
FIG. 5 is a characteristic Raman scan of the deposited TiN film (on sample H) showing the frequency shift at 267 $cm^{-1}$.
Figure 6:
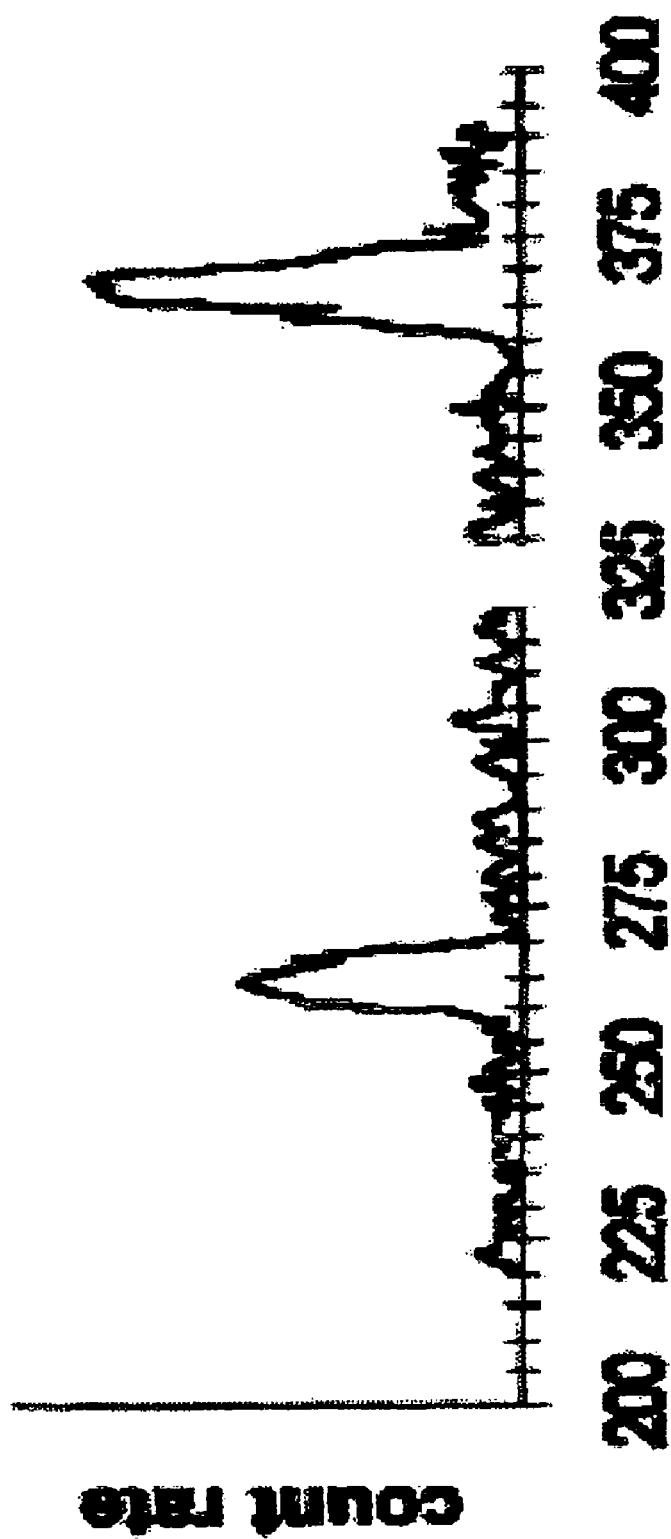
FIG. 6 is a characteristic Raman scan of the deposited TiN film (on sample I) showing the frequency shift at 267 $cm^{-1}$.

The Raman spectra typical of samples D, H and I are shown in FIGS. 4, 5 and 6 respectively. The frequency shift at 267 $cm^{-1}$ is very pronounced for these sample. This corresponds to the calculated value for acoustical phonon scattering for stoichiometric TiN. The presence of the high frequency shift (at optical range) at about 370 $cm^{-1}$ for sample I (FIG. 6) confirms the nonstoichiometric nature of the TiN film for this sample. For this sample, the relatively longer deposition time results to other TiN phases. In this case, $TiN_{0.995}$. The absence of the high frequency shift at 370 $cm^{-1}$ for samples D (FIG. 4) and H (FIG. 5) is an indication of the stoichiometric nature of the produced TiN film on steel under the conditions of the experiment.

Figure 7:
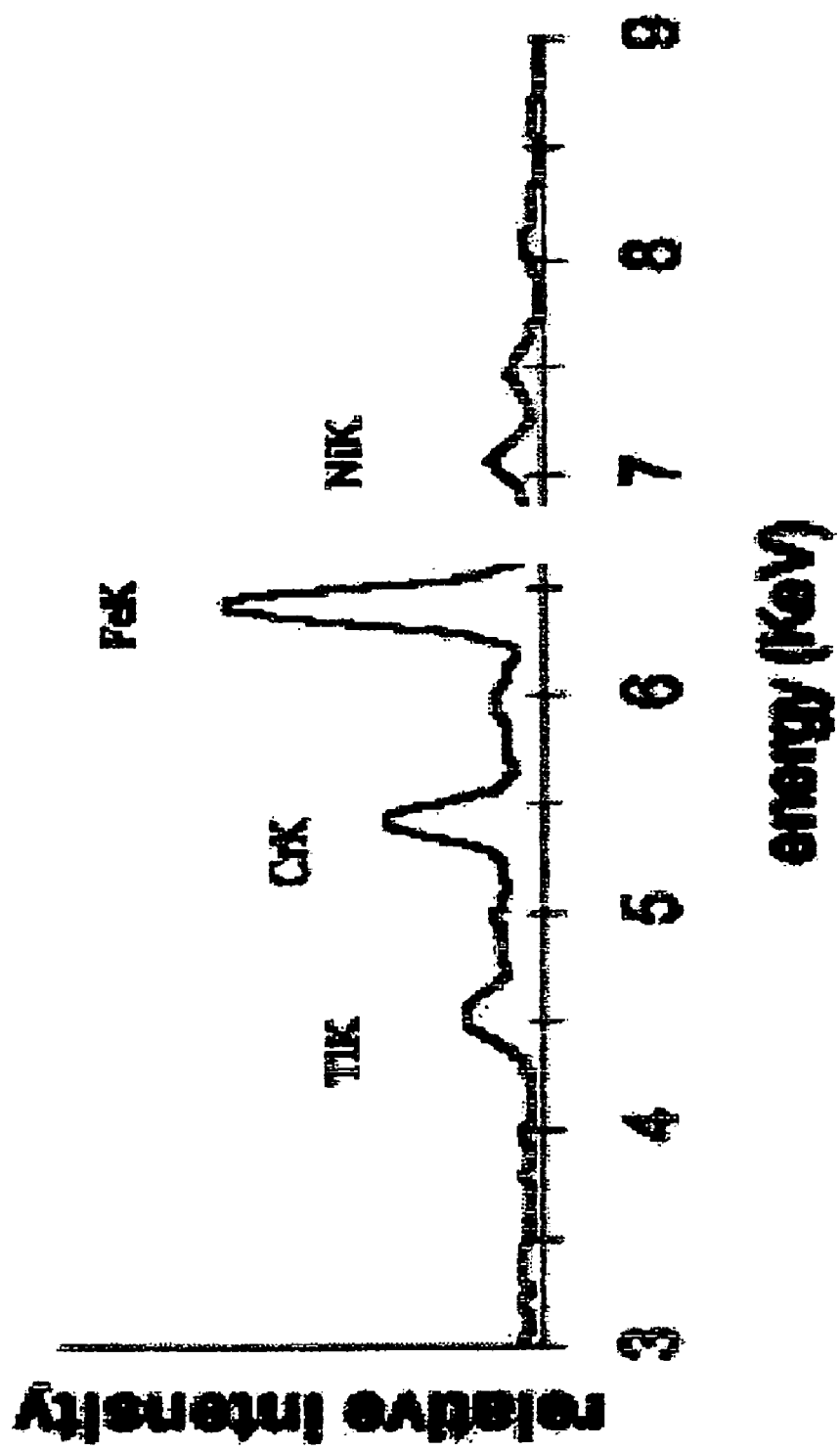
FIG. 7 is a microanalysis of the deposited TiN film (on sample H) by energy dispersive x-ray analysis showing the peak corresponding to the emission of $TiK_\alpha$ radiation at 4.6 eV confirming the presence of titanium.

Results of microanalysis using EDX is shown in FIG. 7 for sample H. The peak corresponding to the emission of TiKα radiation at 4.6 keV confirms the presence of Ti. Other dominant peaks in the figures are those associated with emissions due to metal constituents of the substrate.

Electron micrographs of sample H shows sheet-like structures indicative of a more uniform film formation unlike the case of a columnar type of growth.

CONCLUSION

A magnetized sheet plasma source designed for volume-production of negative hydrogen ions has been slightly modified by placing a titanium disk as target placed at the anode. Argon has been employed as sputtering gas for the titanium target. Nitrogen introduced as reactive gas in the main chamber at preferably 25% of the initial total gas filling pressure of at most about 40 mTorr. Relatively low plasma currents of at least about 3.0 A were found suitable for the production of TiN in the plasma-enhanced chemical vapor deposition process. At these currents, more argon ions are produced to sputter the titanium target thereby increasing the probability of producing the TiN film. The results of the XRD and Raman scans confirm the synthesized TiN films under these conditions.

That which is claimed is:

1. A method for the synthesis of titanium nitride on a metal substrate in a plasma enhanced chemical vapor deposition chamber comprising:

introducing a discharge gas into a production chamber through a low leak valve, the production chamber having a cathode with a tungsten filament;

igniting the discharge gas in the production chamber by thermionic emission of the tungsten filament using a first DC power supply, the ignition of the discharge gas producing a gas plasma discharge;

supplying a potential to the production chamber from a second DC power supply;

stabilizing the gas plasma discharge with a first plasma limiter and a second plasma limiter, wherein the first plasma limiter has a first magnet that acts as a first intermediate electrode, wherein the first intermediate electrode acts as a first anode, wherein the second plasma limiter has a second magnet that acts as a second intermediate electrode, wherein the tungsten filament is negatively biased with respect to the second intermediate electrode;

igniting the gas plasma discharge in a main vacuum chamber using a third DC power supply to generate a potential between the second intermediate electrode and a second anode, the ignition of the gas plasma discharge producing a cylindrical plasma, the main vacuum chamber having a movable substrate holder;

converting the cylindrical plasma in the main vacuum chamber into a sheet plasma via a third magnet and a fourth magnet, the third magnet and the fourth magnet having opposing fields that are separated by a distance;

sputtering a titanium target attachable to the second anode by the gas plasma discharge;

introducing a reactive gas to the main vacuum chamber, the introduction of the reactive gas producing a mixed plasma; and exposing the metal substrate to the mixed plasma.

2. The method of claim 1, wherein said discharge gas is preferably argon.

3. The method of claim 1, wherein said reactive gas is nitrogen.

4. The method of claim 1, wherein the production chamber has a base pressure of at least about $10^{-6}$ Torr and the discharge gas is introduced to the production chamber at a pressure of at least about 30 mTorr.

5. The method of claim 1, wherein the tungsten filament has a potential in the range of about 14V to about 18V and the tungsten filament has a current in the range of about 20 A to about 23 A.

6. The method of claim 1, wherein the potential supplied by the second DC power supply is in the range of about 60V to about 70V and the current is in the range of about 3 A to about 4 A.

7. The method of claim 1, wherein the potential supplied by the third DC power supply is in the range of about 125V to about 150V and the current is in the range of about 0.8 A to about 1.5 A.

8. The method of claim 1, wherein the third magnet and the fourth magnet are (at least about 1.5 kG on the surface, and wherein the third magnet and the fourth magnet are separated by a distance of at least about 10.0 cm outside a chamber wall just after the second intermediate electrode.

9. The method of claim 1, wherein the substrate holder is connectable to an adjustable bellows enabling the substrate holder to move perpendicular to a plane of a core of the sheet plasma to the outer periphery to immerse the metal substrate in the core of the sheet plasma, wherein the substrate holder is susceptible to biasing.

10. The method of claim 1, wherein the reactive gas is introduced to the main vacuum chamber at a ratio of one part to three parts discharge gas in a total initial gas filling pressure of at least about 40 mTorr.

11. The method of claim 1, wherein the metal substrate is exposed to the mixed plasma for a period in the range of about 10 minutes to about 20 minutes.

12. The method of claim 1, wherein the ignition of the gas plasma discharge in the main vacuum chamber is through a sequential switching process utilizing three connectable switches in between the cathode and the second anode.

* * * * *